United States Patent
Biber

(10) Patent No.: US 9,329,247 B2
(45) Date of Patent: May 3, 2016

(54) SHIM COIL ARRANGEMENT FOR AN EXTREMITY OF A PATIENT

(71) Applicant: Stephan Biber, Erlangen (DE)

(72) Inventor: Stephan Biber, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 499 days.

(21) Appl. No.: 13/864,004

(22) Filed: Apr. 16, 2013

(65) Prior Publication Data

US 2013/0274594 A1  Oct. 17, 2013

(30) Foreign Application Priority Data

Apr. 17, 2012 (DE) .......................... 10 2012 206 300

(51) Int. Cl.
*G01V 3/00* (2006.01)
*G01R 33/34* (2006.01)
*G01R 33/3875* (2006.01)
*G01R 33/56* (2006.01)

(52) U.S. Cl.
CPC ...... *G01R 33/34084* (2013.01); *G01R 33/3875* (2013.01); *G01R 33/34046* (2013.01); *G01R 33/5607* (2013.01)

(58) Field of Classification Search
CPC .................................................. G01R 33/3875
USPC .......................................... 324/318, 322, 321
See application file for complete search history.

(56) References Cited

U.S. PATENT DOCUMENTS

| | | | |
|---|---|---|---|
| 5,561,370 A | 10/1996 | Fuderer | |
| 6,002,255 A * | 12/1999 | Pulyer | 324/320 |
| 6,014,069 A | 1/2000 | Havens et al. | |
| 6,023,167 A * | 2/2000 | DeMeester et al. | 324/318 |
| 6,249,121 B1 | 6/2001 | Boskamp et al. | |
| 7,538,553 B2 * | 5/2009 | Trequattrini et al. | 324/319 |
| 8,078,260 B2 * | 12/2011 | Brasile | 600/422 |

(Continued)

FOREIGN PATENT DOCUMENTS

| | | |
|---|---|---|
| CN | 2136011 Y | 6/1993 |
| CN | 1102320 A | 5/1995 |

(Continued)

OTHER PUBLICATIONS

German Office Action dated Dec. 12, 2012 for corresponding German Patent Application No. DE 10 2012 206 300.5 with English translation.

(Continued)

*Primary Examiner* — Louis Arana
(74) *Attorney, Agent, or Firm* — Lempia Summerfield Katz LLC

(57) ABSTRACT

A shim coil arrangement for at least one extremity of a patient such as a forearm and/or a hand for use in a magnetic resonance device is provided. The shim coil arrangement is arranged surrounding a receptacle for the at least one extremity. At least two planar shim coils having a common coil plane that lies at right angles to a direction of a basic magnetic field of the magnetic resonance device in a usage state and/or to a longitudinal direction of the receptacle are arranged around a circumference of the receptacle. A plurality of coil planes succeeding one another in the direction of the basic magnetic field of the magnetic resonance device in the usage state and/or the longitudinal direction of the receptacle and at right angles to the direction of the basic magnetic field and/or the longitudinal direction are provided with at least two planar shim coils.

20 Claims, 2 Drawing Sheets

(56) References Cited

U.S. PATENT DOCUMENTS

| | | |
|---|---|---|
| 8,536,870 B2 * | 9/2013 | Punchard et al. ............. 324/319 |
| 2001/0048306 A1 | 12/2001 | Mueller et al. |
| 2002/0151785 A1 | 10/2002 | Mueller et al. |
| 2004/0207401 A1 | 10/2004 | Kirsch |
| 2007/0164744 A1 | 7/2007 | Kuhara et al. |
| 2011/0260727 A1 | 10/2011 | Punchard et al. |
| 2012/0323113 A1 | 12/2012 | Biber |
| 2013/0193968 A1 | 8/2013 | Biber |
| 2013/0207655 A1 | 8/2013 | Biber |

FOREIGN PATENT DOCUMENTS

| | | |
|---|---|---|
| CN | 1121801 A | 5/1996 |
| CN | 1274563 A | 11/2000 |
| CN | 1386475 A | 12/2002 |
| CN | 1517066 A | 8/2004 |
| CN | 101002678 A | 7/2007 |
| CN | 101203269 A | 6/2008 |
| CN | 101957468 A | 1/2011 |
| DE | 19959720 B4 | 2/2005 |
| DE | 102011080275 A1 | 2/2013 |
| DE | 102011081039 A1 | 2/2013 |
| WO | WO9807362 A2 | 2/1998 |
| WO | WO2009135264 A1 | 11/2009 |

OTHER PUBLICATIONS

Greg Brown, "Fat Suppression Techniques", New Zealand MR Users Meeting, Auckland, Nov. 1996, www.users.on.net/~vision/papers/fatsup/fatweb.htm; 1996.

C. Juchem et al., "Multi-Coil Shimming of the Mouse Brain", Proc. Intl. Soc. Mag. Reson. Med 19, p. 97 (2011).

C. Juchem et al., "Dynamic Multi-Coil Shimming of the Human Brain at 7 Tesla", Proc. Intl. Soc. Mag. Reson. Med. 19, p. 716 (2011).

S-K. Lee et al.,"B0 Shimming in 3 T Bilateral Breast Imaging with Local Shim Coils", Proc. Intl. Soc. Mag. Reson. Med. 19, p. 715 (2011).

R. Salomir et al., "A Fast Calculation Method for Magnetic Field Inhomogeneity Due to an Arbitrary Distribution of Bulk Susceptibility", © 2003 Wiley Periodicals, Inc.; pp. 26-34, (2003).

Chinese Office action for related Chinese Application No. 2013101326668, dated Sep. 1, 2015, with English Translation.

Korean Office action for related Korean Application No. 10-2013-0042337, dated Oct. 16, 2015, with English Translation.

Korean Notice of Grant Decision for related Korean Application No. 10-2013-0042337, dated Jan. 21, 2016, with English Translation.

* cited by examiner

SHIM COIL ARRANGEMENT FOR AN EXTREMITY OF A PATIENT

This application claims the benefit of DE 10 2012 206 300.5, filed on Apr. 17, 2012, which is hereby incorporated by reference.

BACKGROUND

The present embodiments relate to a shim coil arrangement for at least one extremity of a patient (e.g., a forearm and/or a hand) for use in a magnetic resonance device.

Magnetic resonance imaging and magnetic resonance devices suitable for magnetic resonance imaging are known in the prior art. Imaging in magnetic resonance tomography is based on the spins of atomic nuclei that are aligned in a main magnetic field (B0). Also known in the prior art are local coils that are used when the best possible signal-to-noise ratio (SNR) is to be achieved. Local coils are antenna systems that are arranged in immediate proximity to (e.g., on (anterior) or under (posterior)) the patient. During the acquisition of magnetic resonance image data, the excited nuclei induce a voltage in the individual antennas or coil elements of the local coil. The induced voltage is preamplified by a low-noise preamplifier (LNA) and forwarded to a receiving device that processes the magnetic resonance image data further. Efforts to achieve a further improvement in the signal-to-noise ratio (e.g., in the case of high-resolution magnetic resonance images) are centered on the use of systems referred to as high-field systems having a basic magnetic field that has a strength of 1.5 T to 12 T or more.

The homogeneity of the basic magnetic field, the $B_0$ field, of the magnetic resonance device is important for all magnetic resonance imaging purposes. Excessively strong deviations from the homogeneity in the imaging volume may result in artifacts or distortions. Certain applications such as fat saturation, for example, may not be executed when a specific inhomogeneity of the basic magnetic field is present.

Fat saturation (e.g., fatsat) is an imaging technique in which the frequency shift of the protons bound in fat or fat-like materials is used in order to "mask out" the signals originating from the fat tissue by a saturation pulse as a transmit pulse at the fat frequency. Since the difference between the frequency of protons in water and the frequency of protons in fat is very slight (e.g., equivalent to a few ppm of the basic magnetic field), the imaging technique is heavily dependent on the spatial homogeneity of the basic magnetic field.

Efficiently functioning fat saturation is important for many diagnostic problems. This is because pathological tissue exhibits similar or the same contrast behavior as fat in many sequence types. Known fat saturation methods are, for example, the Dixon method and the spectral fat saturation technique.

In spectral fat saturation and related techniques, the fact that protons in fat and protons in water have slightly different resonant frequencies is used. The difference in frequency between protons in fat and protons in water may amount, for example, to approximately 3.1 ppm. A strong transmit pulse on the fat frequency suppresses the signal of the fat protons without affecting the imaging of the protons belonging to the water molecules. The functional effectiveness of all techniques based on the spectral separation of fat and water is dependent on the homogeneity of the basic field. If the basic field exhibits inhomogeneities of a similar order of magnitude to the spectral separation of protons in fat and water, then the fat and water resonances lie on the same resonant frequency and may no longer be separated spectrally.

With known magnetic resonance devices, magnetic field homogeneities having deviations of less than 1 ppm over a volume of approximately 30×40×50 cm may be attained. Problems with inhomogeneities may therefore arise, for example, in regions of the anatomy that lie at the extremities, (e.g., in the region of the shoulder) which may not be positioned centrally due to the lack of space in the patient receiving bore of a magnetic resonance device.

Inhomogeneities arising due to the magnetic resonance devices and the components of the magnetic resonance devices are basically less important because the inhomogeneities are estimable and deterministic. The inhomogeneities introduced by the tissue of the patient are more important, as explained, for example, in a summarizing article on the occasion of the "New Zealand MR Users' Meeting" in Auckland, November 1996, with the title "Fat Suppression Techniques", author Greg Brown, cf. http://www.users.on.net/~vision/papers/fatsup/fatweb.htm.

Human tissue exhibits a relative magnetic permeability that is different from 1. As a result, the discontinuities between air and tissue and interfaces between different types of tissue having different magnetic susceptibility, for example, lead to relevant (local) basic magnetic field distortions. The inhomogeneous distribution of water/air/bone/fat in the human body also leads to a distortion of the basic magnetic field that is different for each patient.

The field distortion is problematic in the case of extremities (e.g., the knee, the elbow, the arms, the legs, the foot; in the hand/finger region), where sudden, geometrically complex susceptibility changes occur between the anatomy and the surrounding space (e.g., the air or a local coil housing). Local coils for wrists and hands are known in the prior art. The local coils for wrists and hands may have a receptacle around which the coil elements of the local coil (e.g., on the surface of the receptacle) are arranged.

A technique known as "shimming" is known for resolving the problems associated with inhomogeneous basic magnetic fields. While a static shimming operation (e.g., using metal shim elements) may not eliminate the inhomogeneities of the basic magnetic field that are specifically caused by a patient, methods in which shim coils that generate correction fields intended to restore the basic field homogeneity in the imaging region are used are also known. For shim coils of this type, it is known to provide the shim coils, for example, on the housing of the magnetic resonance device, consequently remote from the body. In order therefore to compensate for locally strong field gradients, such as occur, for example, in the hand/finger region due to the sudden, geometrically complex susceptibility changes, very high-order shim coils that have a complex geometry and require a large installation space, as well as having very low efficiency are provided. Such shim coils use a high current and produce a high level of waste heat in return for a relatively small generation of correction fields.

SUMMARY AND DESCRIPTION

The scope of the present invention is defined solely by the appended claims and is not affected to any degree by the statements within this summary.

Even when higher-order shim coils are used, depending on anatomy and positioning, inhomogeneities of the basic magnetic field for which the shim quality of the patient-remote shim coils is inadequate may also occur. For example, shim coils integrated in the magnetic resonance device that, with currents in the range of 0-20 A, may compensate for inhomogeneities of the basic magnetic field on an individual patient basis (e.g., after a calibration measurement) may also occur. Such systems are unable to offer any solution for strongly localized effects such as occur in the region of the hand and, for example, of the fingers. As a consequence, it has not been possible thus far in the prior art to image the anatomical region of forearm/wrist/hand/fingers with an acceptable quality using imaging techniques based on spectral fat saturation.

The present embodiments may obviate one or more of the drawbacks or limitations in the related art. For example, a shim coil arrangement that also allows inhomogeneities of a basic magnetic field occurring due to strong, local magnetic field gradients to be compensated for and enables an adequate homogeneity of the basic magnetic field to be established so that fat saturation techniques may be employed is provided.

One embodiment of a shim coil arrangement is arranged surrounding a receptacle for an extremity. At least two planar shim coils having a common coil plane that lies at right angles to a direction of the basic magnetic field of a magnetic resonance device in a usage state and/or to a longitudinal direction of the receptacle are arranged around the circumference of the receptacle. A plurality of coil planes succeeding one another in the direction of the basic magnetic field of the magnetic resonance device in the usage state and/or the longitudinal direction of the receptacle and at right angles to the direction of the basic magnetic field of the magnetic resonance device in the usage state and/or the longitudinal direction of the receptacle are provided with shim coils.

Local shim coils are accordingly arranged close to the extremity that is to be scanned (e.g., immediately surrounding a receptacle for the extremity). In one embodiment, the shim coil arrangement may be integrated into a local coil enclosing the receptacle. Such a local coil may be used for receiving the magnetic resonance signals.

The shim coil arrangement is suitable, for example, for the region of a patient's hand, since various discrete changes in susceptibility are present at the hand due to the different lengths of the fingers, the small thickness of the fingers, and the complex shape of the hand and of the transition from the hand to the wrist. Such changes lead to an extremely complex distortion of the basic magnetic field. This may be optimally compensated for if many local shim coils, each of which is activated according to the individual anatomy and the basic magnetic field distortion resulting therefrom, are available for activation. The shim coils are arranged in coil planes standing at right angles to the direction of the basic magnetic field (e.g., the z-direction). Shim coils aligned in such a way enable an activation to be chosen such that as far as possible the basic magnetic field receives the same amplitude in the z-direction at all points in space. Shim coils may be arranged above, below and on both sides of the anatomy (consequently of the receptacle). In one embodiment, a plurality of coil planes having shim coils succeed one another in the z-direction (e.g., the direction of the basic magnetic field, which may correspond to the longitudinal direction of a patient receiving bore of the magnetic resonance device). By this, the basic magnetic field gradients running in the anterior-posterior direction and in the sagittal direction, which are caused primarily by the susceptibility distribution of the anatomy and only secondarily by the inhomogeneity of the basic field magnet, may also be compensated for.

In one embodiment, a plurality of skillfully arranged shim coils is provided. A complex shim field counteracting the consequences of the complex susceptibility changes may thus be generated in a targeted manner in order to establish the basic field homogeneity in the imaging region (e.g., therefore, in the imaging region of a local coil into which the shim coil arrangement is integrated).

A maximally symmetric configuration of the shim coil arrangement is beneficial, such that an even number of shim coils, for example, is provided in each shim plane. Two shim coils in each case are arranged opposite one another in relation to the receptacle. The shim coils may generate magnetic field gradients in the region between the shim coils in an elegant manner in order to compensate for the basic magnetic field gradients induced due to susceptibility changes.

At least one shim coil may be provided on all sides of the receptacle (e.g., if at least two coils disposed opposite one another are provided in each case in the sagittal direction and in the transverse direction). The sagittal direction, which stands perpendicularly on the frontal plane, corresponds, for example, to the vertical direction (e.g., in the context of magnetic resonance devices, the y-direction). The transverse direction stands perpendicularly on the sagittal plane and consequently designates the horizontal (e.g., right-to-left). In the case of magnetic resonance devices, this direction may be referred to as the x-direction.

The different directions may thus be covered with sufficient precision, although a greater number of shim coils on each side enables a shim field to be adjusted with greater precision and consequently to be better fitted to the actual anatomy. In one embodiment, at least eight shim coils, for example, are provided surrounding the receptacle in a common coil plane. A high number of shim coils may be provided for optimally compensating for basic magnetic field distortions due to sudden changes in susceptibility.

In one embodiment, in the case of a shim coil arrangement provided in a housing that may be at least partially swiveled open along a frontal plane that is horizontal in the usage state, at least one shim coil is provided above and at least one shim coil is provided below the frontal plane on each side on opposite sides of the receptacle that are interrupted by the frontal plane. Thus, for example, wrist and/or hand local coils, the housing of which may be swiveled open and consequently is split along a frontal plane, are already known in the prior art. The shim coils may be divided up so that some of the shim coils are located above, and some of the shim coils are located below the frontal plane that serves for swiveling open the local coil or the shim coil arrangement. A division of the shim coils into shim coils on the anterior side and shim coils on the posterior side may thus be provided. This permits plated-through interconnection holes for the shim coils from the top part of the housing into the bottom part of the housing to be avoided. An openable shim coil arrangement and an openable local coil may thus also be provided without many additional electrical contact points in the housing.

In one embodiment, at least some of the shim coils may be supplied with current independently (e.g., via a control device). By this ability to activate the individual shim coils separately, extremely complex shim fields that may handle the extremely complex susceptibility distributions of an actual patient and establish the requisite homogeneity in order to enable fat saturation techniques to be employed, for example, may be provided.

At least some of the shim coils may be connected in parallel with one another or in series. The shim channels to be activated may be reduced, since two or more shim coils may be operated in series or in parallel.

In one embodiment, the control device is embodied for supplying the shim coils with current on the basis of a fixed specification stored, for example, in a memory device of the control device and/or for determining shim currents taking into account at least one patient parameter. An actual specification for the shim currents that is optimally tailored to the different possible embodiments of extremities (e.g., hands) of the patients and already enables an improvement may be stored. Such a specification may be varied adaptively to suit a particular patient, or the specification may be selected on a patient-specific basis. Accordingly, shim currents taking into account at least one patient parameter (e.g., from at least one specification) may be determined. For example, anatomical data of the patient, the weight of the patient, the size of the patient, the sex of the patient, the age of the patient, and/or positioning data of a patient couch may be taken into account as patient parameters. A better fit to the actual patient may thus be achieved.

In one embodiment, the control device is embodied for determining shim currents on the basis of a measurement of a basic magnetic field distortion (e.g., using an iterative method). In this embodiment, the basic magnetic field distortion is therefore measured initially. Since the geometric position of the shim coils is known, shim currents for compensating for the basic magnetic field distortions may be calculated on the basis of these measurement results. When the currents are applied, the basic magnetic field distortions are compensated for. The measurement and the calculation of the shim currents may be repeated iteratively until the measurement yields a desired basic magnetic field homogeneity. Thereafter, the actual image data acquisition may take place in the clinical measurement (e.g., using a spectral fat saturation technique).

In another embodiment, a lowpass filter is connected upstream of each shim coil. Providing the shim coils with lowpass filters is advantageous when radio-frequency local coil elements are present in the vicinity (e.g., when the shim coil arrangement is integrated into a local coil). Such coil elements of the local coil operate, for example, at 40-300 MHz for 1-7 T, in which case a lowpass filter permits any interaction with the coil elements to be prevented. Chokes having inductances of 1-10 µH in series may be used, for example, for this purpose. LC lowpass filters may be used.

In one embodiment, a local coil for an extremity (e.g., a hand and/or a forearm) of a patient for use in a magnetic resonance device is provided. The local coil includes a receptacle for the extremity and a shim coil arrangement integrated into the local coil. All statements made in relation to the shim coil arrangement may be applied analogously to the local coil, by which the advantages of one or more of the present embodiments may therefore also be obtained. For example, as a result of the integration of shim coil arrangement and local coil, measurement with a low signal-to-noise ratio and correction of local inhomogeneities may be provided with a single component (e.g., the local coil with integrated shim coil arrangement). The coil is, for example, a hand and/or wrist local coil. A local coil of this type may include a plurality of coil elements (e.g., 32 or 64 coil elements) disposed close to the surface (e.g., the surface of the receptacle). The coil elements may be provided, for example, largely integrally molded on the anatomically shaped surface of the coil housing. The shim coils may be arranged at right angles with respect to the coil housing surface (e.g., in the coil planes).

In one embodiment, the coil elements of the local coil are arranged adjacent to a surface of the receptacle, and the shim coils are integrated further toward the outside in a housing of the local coil. The coil elements of the local coil may still be placed in the greatest possible proximity to the extremity to be examined, while the shim coils adjoin further toward the outside.

The local coil may have a housing that may be at least partially swiveled open along a frontal plane that is horizontal in the usage state. Accordingly, shim coils may be provided on both sides of the frontal plane, thereby reducing the numbers of electrical connections used between the top part and the bottom part.

The current feeds of the shim coils may be realized collectively at least for a portion of the housing that may not be swiveled open along the frontal plane. The local coil, although the local coil may be swiveled open, includes, at least in part, for example, in the region in front of the fingers, a common top and bottom part. The wiring of the shim coils of the top and the bottom part may be routed together to form a cable harness, a distributor board or the like.

DETAILED DESCRIPTION OF THE DRAWINGS

The present embodiments are explained in more detail below, taking as an example, a local coil embodied as a wrist coil or hand coil into which a shim coil arrangement is integrated. The problem underlying one or more of the present embodiments is first explained in more detail on the basis of the schematic diagram in FIG. 1.

Figure 1:
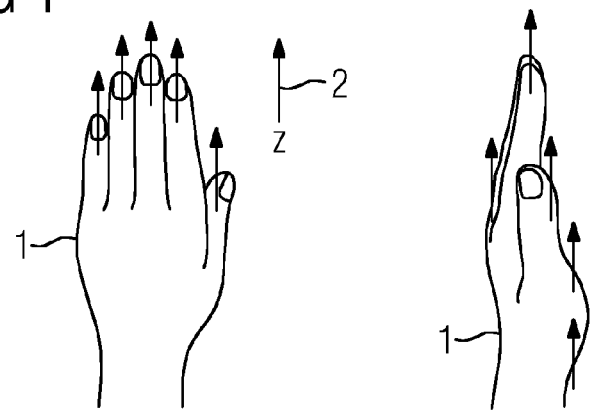
FIG. 1 is a schematic diagram illustrating a susceptibility profile in the case of a hand.

FIG. 1 shows a hand 1 in two cross-sections at right angles to one another. The direction of the basic magnetic field (z-direction), which also corresponds to the longitudinal direction of a receptacle for the hand 1, is indicated more precisely by the arrow 2. A susceptibility (e.g., that of tissue and/or bone) is present within the hand 1. This susceptibility is markedly different from the susceptibility of the air that is around 1. For this reason, sudden susceptibility changes, indicated by arrows parallel to the arrow 2, occur at the transitions. The susceptibility changes induce distortions of the basic magnetic field and consequently inhomogeneities when the hand 1 is positioned inside the local coil in a magnetic resonance device.

Two positioning possibilities may, for example, be provided for a hand inside the patient receiving bore of a magnetic resonance device (e.g., first, when the hand is held to the side of the body, hence vertically). Accordingly, the palm of the hand lies substantially parallel to the sagittal plane of the patient, which may be referred to as the y-z plane inside the patient receiving bore, where y designates the vertical.

In one embodiment, for positioning a hand, the hand may be stretched over the head and may be positioned flat above the patient couch such that the hand may be positioned as centrally as possible in the patient receiving bore of the magnetic resonance device. The palm of the hand lies substantially parallel to the frontal plane of the patient, which forms an x-z plane with respect to the patient receiving bore, such that x designates the horizontal direction in the patient receiving bore of the magnetic resonance device.

In both cases, as has already been described, the geometrically complex susceptibility profiles (cf., FIG. 1) produce geometrically equally complex field distortions that may lie, for example, in the range from 1 up to 10 ppm. This provides, for example, that fat saturation techniques (e.g., fat saturation techniques based on spectral fat saturation) may no longer be correctly applied. For this reason, a shim coil arrangement that is integrated into the local coil and consequently is present close to the patient, and may correct the complex field distortions on account of a large number of individual shim coils to such an extent that a sufficient homogeneity for fat saturation techniques is present is provided.

Figure 2:
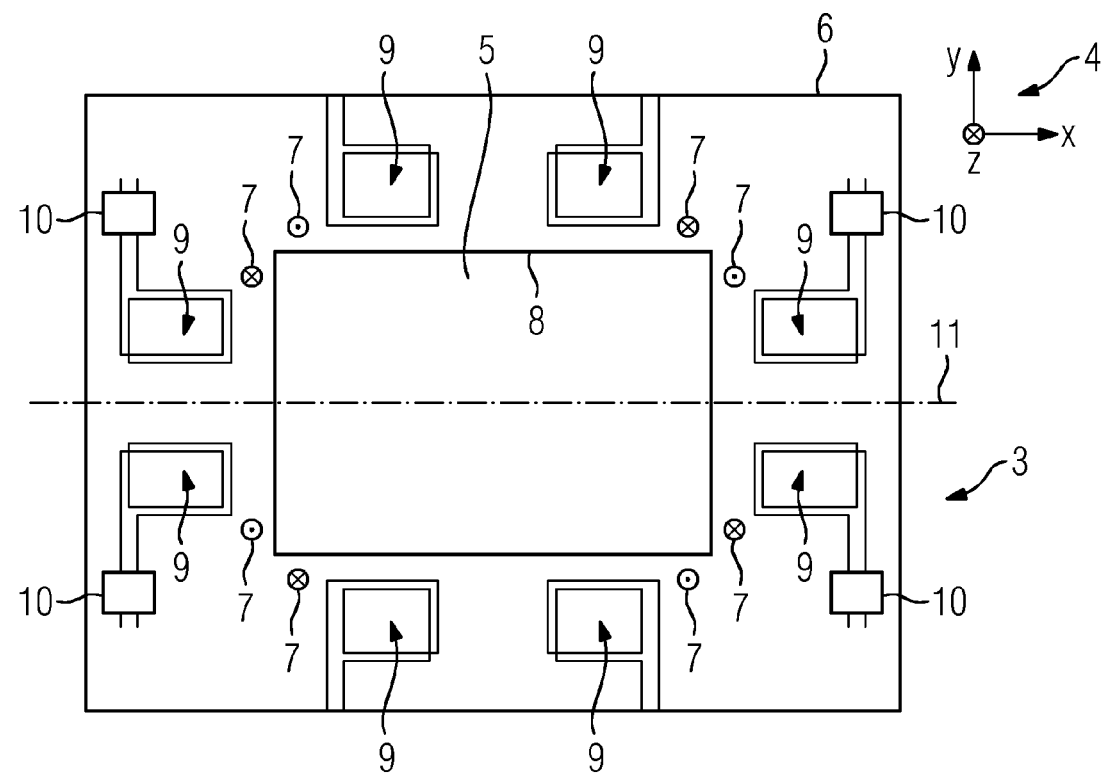
FIG. 2 shows a cross-section of one embodiment of a local coil.

FIG. 2 is a schematic diagram showing a cross-section through one embodiment of a local coil 3, which in this case, as the coordinate system 4 indicates, lies in an x-y plane. The coordinate system 4 also indicates the z-direction, which corresponds to the direction of the basic magnetic field and corresponds to the longitudinal direction of the receptacle 5 provided centrally for the hand and the wrist. In this case, the receptacle 5 may be anatomically molded to the shape of the hand. For the sake of simplicity, however, this is not shown here. The receptacle 5 is defined by a housing 6 of the local coil 3. The coil elements 7 of the local coil 3, which are therefore embodied for receiving the magnetic resonance signals, are arranged, as shown, along the receptacle-side surface 8 of the housing 6. Provided in the housing 6 succeeding the coil elements 7, starting from the surface 8 toward the outside, are shim coils 9 (e.g., eight shim coils 9 in a common coil plane corresponding to the x-y section plane). In this arrangement, the shim coils 9 of the coil plane cover the entire circumference of the receptacle 5. Two shim coils 9 in each case are provided on each side of the receptacle 5. Two shim coils 9 are disposed opposite one another in each case. For clarity of illustration, the exact further wiring of the shim coils 9 is not depicted in greater detail, just as a lowpass filter 10 is similarly shown only for the two left-hand and the two right-hand shim coils 9. Such a filter is basically provided for all of the shim coils 9 in order to avoid an interaction with the coil elements 7.

Figure 4:
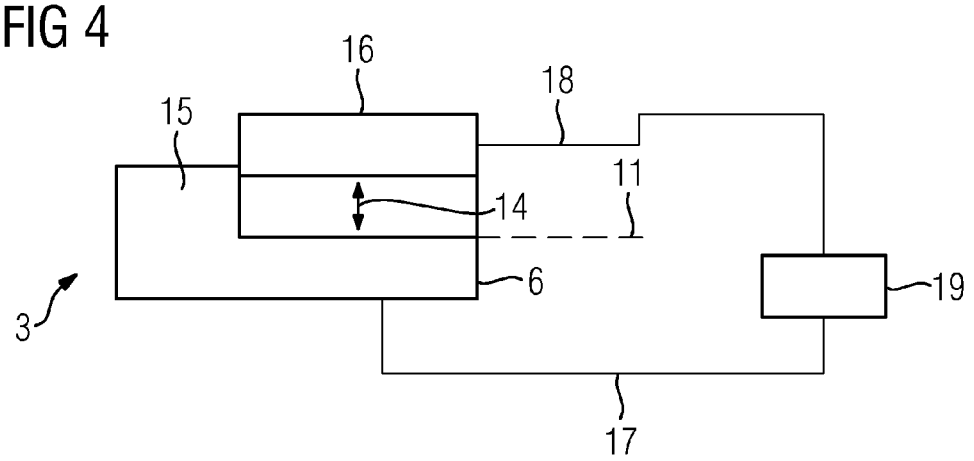
FIG. 4 shows a side view of one embodiment of a local coil.

Also indicated in FIG. 2 is a frontal plane 11 along which the housing 6 is at least partially split in order to allow a swing-open operation. This is explained in more detail with reference to FIG. 4. As shown in FIG. 4, the shim coils 9 disposed at the sides are arranged such that one shim coil 9 is provided on each side of the frontal plane 11. Thus, no plated-through interconnection holes through the frontal plane 11 are necessary.

Figure 3:
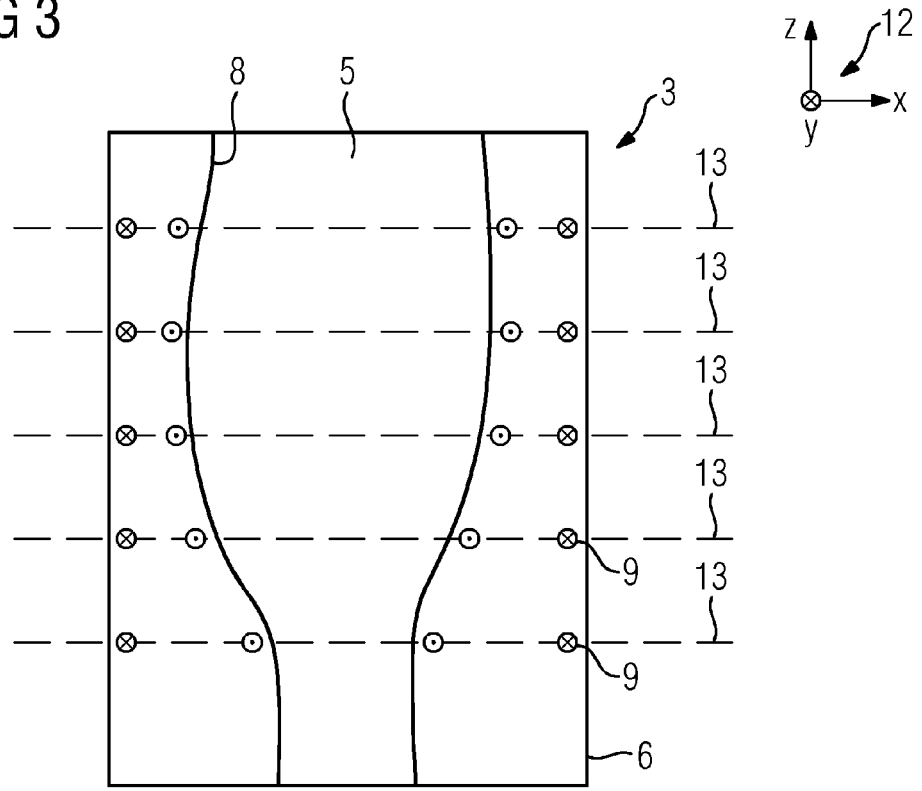
FIG. 3 shows a longitudinal section of one embodiment of a local coil.

FIG. 3 shows in schematic form a longitudinal section through the local coil 3 in the z-x plane, as is explained in more detail by the coordinate system 12. For clarity of illustration, the coil elements 7 are no longer represented; instead, the shape of the receptacle 5 adapted to the anatomy of the hand is shown.

In the z-direction (e.g., the longitudinal direction of the receptacle and the direction of the basic magnetic field in the usage state), a plurality of parallel coil planes 13 having shim coils 9 arranged therein succeed one another.

Accordingly, a plurality of arranged shim coils 9 that, in contrast to the coil elements 7, are arranged in coil planes 13 substantially vertically with respect to the anatomically molded surface 8 of the coil housing 6, such that the field in said coil planes 13 may be compensated for by suitable application of current to the shim coils 9 such that as far as possible the field receives the same amplitude in the z-direction, are provided. By providing shim coils in a plurality of coil planes along the z-direction, basic field gradients running in the x-direction and in the y-direction may be compensated for. Basic field gradients running, as far as possible, in opposite directions are generated by the shim coils 9. In this way, the strongly localized basic field inhomogeneities, which lead, for example, to the failure of spectral fat saturation techniques, may be compensated for. Basic field gradients may be generated in multiple directions by the specific arrangement of the shim coils 9.

FIG. 4 shows a schematic side view of one embodiment of the local coil 3. Only a part of the housing 6, split along the frontal plane 11 and consequently able to be swung open (arrow 14), is shown. Accordingly, the housing 6 exists in two parts 15, 16, the cabling of which, insofar as the shim coils 9 are concerned, is routed away jointly from the part 15, 16, for example, as cable harnesses 17, 18, respectively. A control device 19 of the shim coil arrangement is also schematically indicated in FIG. 4.

The shim coils 9 of the shim coil arrangement that is integrated into the local coil 3 are in large part (e.g., in entirety) able to be activated independently, while at least some of the shim coils 9 may be connected in parallel or in series in order to reduce the number of channels to be activated.

With the local coil 3 in the usage state, the shim currents are determined such that in the first instance, a measurement of the basic magnetic field is carried out without activated shim currents. From this, the basic field distortions may be derived. If the basic field distortions are known, shim currents that optimally compensate for the inhomogeneities may be calculated from the basic field distortions on the basis of the known arrangement of the shim coils 9. This process may be repeated iteratively, which provides that the determined shim currents are applied, and a new measurement is carried out. The shim currents may be adjusted, or, if an adequate homogeneity is present, definitive shim currents may be used for the actual acquisition of measurement data.

In an alternative embodiment, however, a specification or a plurality of specifications may be stored for the shim currents of the control device 19. In such a case, an adjustment may be made on the basis of patient parameters. Such patient parameters may include anatomical data, the weight, the size, the sex and the age of the patient. In one embodiment, the couch position may be considered in order to make a further adjustment to fit the individual situation.

Although the invention has been illustrated and described in detail on the basis of the exemplary embodiment, the invention is not limited by the examples disclosed, and other variations may be derived herefrom by the person skilled in the art without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A shim coil arrangement for at least one extremity of a patient for use in a magnetic resonance device, wherein the shim coil arrangement is arranged surrounding a receptacle for the at least one extremity, the shim coil arrangement comprising:
- at least two planar shim coils having a common coil plane that lies at right angles to a direction of a basic magnetic field of the magnetic resonance device in a usage state, to a longitudinal direction of the receptacle, or to the direction of the basic magnetic field of the magnetic resonance device in the usage state and the longitudinal direction of the receptacle, the at least two planar shim coils being arranged around the circumference of the receptacle,
- wherein a plurality of coil planes succeeding one another in the direction of the basic magnetic field of the magnetic resonance device in the usage state, the longitudinal direction of the receptacle, or the basic magnetic field of the magnetic resonance device in the usage state and the longitudinal direction of the receptacle and at right angles to the direction of the basic magnetic field of the magnetic resonance device in the usage state, the longitudinal direction of the receptacle, or the basic magnetic field of the magnetic resonance device in the usage device and the longitudinal direction of the receptacle are provided with the at least two planar shim coils.

2. The shim coil arrangement as claimed in claim 1, wherein the at least one extremity is a forearm, a hand, or the forearm and the hand.

3. The shim coil arrangement as claimed in claim 1, wherein an even number of shim coils of the at least two planar shim coils is provided in each coil plane of the plurality of coil planes, and
wherein two shim coils of the at least two planar shim coils in each case are arranged opposite one another in relation to the receptacle.

4. The shim coil arrangement as claimed in claim 1, wherein the shim coil arrangement is integrated into a local coil enclosing the receptacle.

5. The shim coil arrangement as claimed in claim 1, wherein at least one shim coil of the at least two planar shim coils is provided on all sides of the receptacle.

6. The shim coil arrangement as claimed in claim 5, wherein at least two shim coils of the at least two planar shim coils disposed opposite one another in each case are provided in a sagittal direction and in a transverse direction, at least eight shim coils of the at least two planar shim coils are provided surrounding the receptacle in a common coil plane, or a combination thereof.

7. The shim coil arrangement as claimed in claim 1, wherein the shim coil arrangement is provided in a housing that is at least partially swivelable open along a frontal plane that is horizontal in the usage state,
wherein at least one shim coil of the at least two planar shim coils is provided above the frontal plane, and at least one shim coil of the at least two planar shim coils is provided below the frontal plane on each side on opposite sides of the receptacle, which are interrupted by the frontal plane.

8. The shim coil arrangement as claimed in claim 1, wherein at least some shim coils of the at least two planar shim coils are suppliable with current independently.

9. The shim coil arrangement as claimed in claim 8, wherein the at least some shim coils are suppliable with the current independently via a control device.

10. The shim coil arrangement as claimed in claim 9, wherein at least some shim coils of the at least two planar shim coils are connected in parallel with one another or in series.

11. The shim coil arrangement as claimed in claim 9, wherein the control device is configured to supply current to the at least some shim coils on the basis of a fixed specification stored in a memory device of the control device, configured to determine shim currents taking into account at least one patient parameter, or a combination thereof.

12. The shim coil arrangement as claimed in claim 9, wherein the control device is configured to determine shim currents on the basis of a measurement of a basic magnetic field distortion.

13. The shim coil arrangement as claimed in claim 12, wherein the control device is configured to determine the shim currents on the basis of the measurement of the basic magnetic field distortion using an iterative method.

14. The shim coil arrangement as claimed in claim 1, further comprising a lowpass filter, the lowpass filter being connected upstream of each shim coil of the at least two planar shim coils.

15. A local coil for an extremity of a patient for use in a magnetic resonance device, the local coil comprising:
- a receptacle for the extremity; and
- a shim coil arrangement integrated into the local coil, wherein the shim coil arrangement is arranged surrounding the receptacle for the extremity, the shim coil arrangement comprising:
  - at least two planar shim coils having a common coil plane that lies at right angles to a direction of a basic magnetic field of the magnetic resonance device in a usage state, to a longitudinal direction of the receptacle, or to the direction of the basic magnetic field of the magnetic resonance device in the usage state and the longitudinal direction of the receptacle, the at least two planar shim coils being arranged around the circumference of the receptacle,
- wherein a plurality of coil planes succeeding one another in the direction of the basic magnetic field of the magnetic resonance device in the usage state, the longitudinal direction of the receptacle, or the basic magnetic field of the magnetic resonance device in the usage state and the longitudinal direction of the receptacle and at right angles to the direction of the basic magnetic field of the magnetic resonance device in the usage state, the longitudinal direction of the receptacle, or the basic magnetic field of the magnetic resonance device in the usage device and the longitudinal direction of the receptacle are provided with the at least two planar shim coils.

16. The local coil as claimed in claim 15, wherein the extremity is a hand, a forearm, or a hand and forearm.

17. The local coil as claimed in claim 15, further comprising:
- coil elements that are arranged adjacent to a surface of the receptacle; and
- a housing,
wherein the at least two planar shim coils are integrated further toward the outside in the housing.

18. The local coil as claimed in claim 15, further comprising a housing that is at least partially swivelable open along a frontal plane that is horizontal in a usage state.

19. The local coil as claimed in claim 18, wherein current feeds of the at least two shim coils are realized collectively at least for a portion of the housing, the portion of the housing not being swivelable open along the frontal plane.

20. The local coil as claimed in claim 17, wherein the housing is at least partially swivelable open along a frontal plane that is horizontal in a usage state.

* * * * *